(12) United States Patent
Outaleb et al.

(10) Patent No.: US 7,135,918 B1
(45) Date of Patent: Nov. 14, 2006

(54) LINEAR POWER AMPLIFIER CIRCUIT WITH A MODULATED POWER SUPPLY SIGNAL

(75) Inventors: Noureddine Outaleb, Nepean (CA); Philip Holder, Bishops Stortford (GB); John Ilowski, Nepean (CA); Graham Dolman, Saffron Walden (GB)

(73) Assignee: Nortel Networks Limited, St. Laurent (CA)

( * ) Notice: Subject to any disclaimer, the term of this patent is extended or adjusted under 35 U.S.C. 154(b) by 49 days.

(21) Appl. No.: 10/969,881

(22) Filed: Oct. 22, 2004

(51) Int. Cl.
*H03F 3/38* (2006.01)
*H03G 3/20* (2006.01)

(52) U.S. Cl. .................................. 330/10; 330/136

(58) Field of Classification Search ................. 330/136
See application file for complete search history.

(56) References Cited

U.S. PATENT DOCUMENTS

| 5,831,475 A | * | 11/1998 | Myers et al. ................. 330/10 |
| 6,492,867 B1 | * | 12/2002 | Bar-David .................... 330/10 |

* cited by examiner

*Primary Examiner*—Robert Pascal
*Assistant Examiner*—Alan Wong

(57) ABSTRACT

A power efficient system and method for linear signal power amplification are provided. A linear power amplifier provides signal amplification from a system input to a system output and is drain-modulated with a power supply signal. An active compensation circuit generates the power supply signal, which is substantially proportional to an envelope of the system input, and provides it to the power amplifier through a low-impedance output. The active compensation circuit reduces noise in the system output spectrum.

20 Claims, 6 Drawing Sheets

LINEAR POWER AMPLIFIER CIRCUIT WITH A MODULATED POWER SUPPLY SIGNAL

FIELD OF THE INVENTION

The present invention relates to a linear power amplifier circuit with a modulated power supply signal.

BACKGROUND

A linear power amplifier generates an output signal, which is an amplified version of an input signal. When the linear power amplifier is powered by a static power supply, the power efficiency is seen to be very poor. There is considerable motivation to be able to increase the power efficiency of the linear power amplifier in order to reduce operating costs.

An existing technique called drain modulation improves the power efficiency of the linear power amplifier. Instead of using a static power supply, the linear power amplifier is supplied with a power supply signal that is a high-power modulated form of the input signal. The power supply signal driving the linear power amplifier tracks the envelope of the input signal resulting in a power efficiency increase. However, considerable noise in the output signal spectrum restricts the practical application of this technique

SUMMARY OF THE INVENTION

According to one broad aspect, the invention provides a system providing signal power amplification, the system comprising: a) a power amplifier providing signal power amplification to an input signal to produce an output signal, the power amplifier receiving a power supply signal; b) a modulator generating a high-power modulated signal as a function of the input signal; and c) an active compensation circuit converting the high-power modulated signal into the power supply signal and delivering this to the power amplifier through a low impedance output.

In some embodiments, the modulator produces the high-power modulated signal such that it is substantially proportional to an envelope of the input signal.

In some embodiments, a) the active compensation circuit has a first input accepting a low-power modulated signal that is substantially proportional to an envelope of the input signal and has a second input accepting the high-power modulated signal; and b) the active compensation circuit produces the power supply signal through a low impedance output by applying the power of the high-power modulated signal to the low-power modulated signal.

In some embodiments, the system further comprises at least one signal conditioner circuit adapted to produce a modulator control signal for the modulator and the low-power modulated signal.

In some embodiments, the at least one signal conditioner circuit generates the modulator control signal for the modulator and the low-power modulated signal with an offset to compensate for voltage drops across the active compensation circuit.

In some embodiments, the active compensation circuit comprises a transistor with a low output impedance, a fast frequency response, and a high power handing capability.

In some embodiments, the transistor is a bipolar junction transistor (BJT) having a base connected to receive the low-power modulated signal, a collector connected to receive the high-power modulated signal and an emitter connected to produce the power supply signal.

In some embodiments, the transistor is a field effect transistor (FET) having a gate connected to receive the low-power modulated signal, a drain connected to receive the high-power modulated signal and a source connected to produce the power supply signal.

In some embodiments, the active compensation circuit comprises a Darlington pair of transistors with a low output impedance, a fast frequency response, and a high power handling capability.

In some embodiments, the Darlington pair comprises a first BJT and a second BJT with a collector of both BJTs connected to receive the high power modulated signal, an emitter of the second BJT connected to produce the power supply signal, an emitter of the first BJT connected to a base of the second BJT, and a base of the first BJT connected to receive the low power modulated signal.

In some embodiments, the Darlington pair comprises a first FET and a second FET with a drain of both FETs connected to receive the high power modulated signal, a source of the second FET connected to produce the power supply signal, a source of the first FET connected to a gate of the second FET, and a gate of the first FET connected to receive the low power modulated signal.

In some embodiments, the low-power modulated signal is of relatively high resolution compared with the high-power modulated signal.

In some embodiments, the at least one signal conditioner comprises: a) a pre-distorter adapted to predistort the input signal before the input signal is passed to the power amplifier; b) an envelope detector to detect the envelope of the input signal; and c) an envelope conditioner for producing the modulator control signal for the modulator and the low power modulated signal.

In some embodiments, the envelope conditioner synchronises the modulator control signal and the low power modulated signal so that the low-power modulated signal and the high-power modulated signal arrive synchronously within the active compensation circuit.

In some embodiments, the envelope conditioner generates the high power modulated signal and the low power modulated signal so that the power supply signal is always greater than a predetermined minimum.

In some embodiments, the modulator comprises a switching regulator and a low pass filter connected in sequence.

In some embodiments, the active compensation circuit comprises transformation circuitry adapted to perform voltage amplification and filtering of the low-power modulated signal before the active compensation circuit applies the power of the high-power modulated signal to the low-power modulated signal.

In some embodiments, the transformation circuitry comprises a first buffer, a low pass filter, a second buffer, connected in sequence and to a first input of a differential amplifier, a second input of the differential amplifier connected to a feedback path.

According to another broad aspect, the invention provides a method of providing signal power amplification, the method comprising: a) applying signal power amplification from an input signal to an output signal with use of a power supply signal; b) generating the power supply signal as a function of the system input; and c) delivering the power supply signal through a low-impedance output for the signal power amplification.

In some embodiments, the power supply signal is substantially proportional to an envelope of the input signal.

In some embodiments, the power supply signal is generated using a low-power modulated signal while using power from a high-power modulated signal, the low-power modulated signal and high-power modulated signal being substantially proportional to an envelope of the system input.

In some embodiments, the low-power modulated signal and high-power modulated signal is generated from an envelope of the input signal with an offset to compensate for voltage drops during the generation of the power supply signal.

In some embodiments, the low-power modulated signal and the high-power modulated signal are synchronised so that the low-power modulated signal and the high-power modulated signal arrive synchronously where the power supply signal is generated.

In some embodiments, the low-power modulated signal and the high-power modulated signal are generated so that the power supply signal is always greater than a predetermined minimum.

BRIEF DESCRIPTION OF THE DRAWINGS

The invention will now be described in greater detail with reference to the accompanying drawings, in which.

DETAILED DESCRIPTION OF THE PREFERRED EMBODIMENTS

Figure 1:
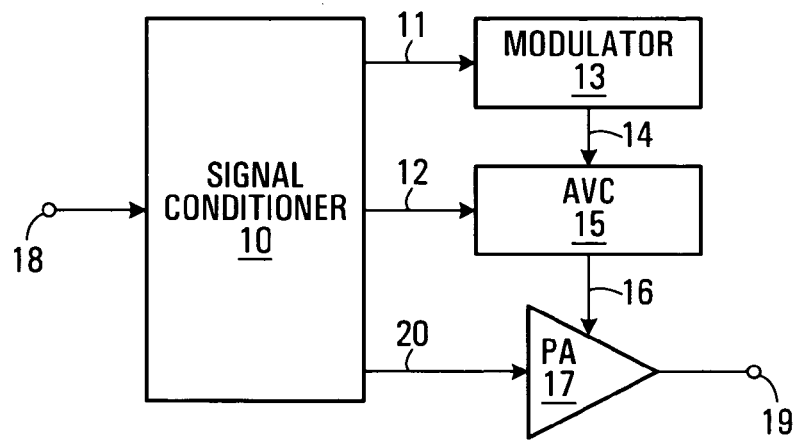
FIG. 1 is a top-level schematic of the system providing signal power amplification in accordance with an embodiment of the invention.

Referring now to FIG. 1, a top-level schematic of a system providing signal power amplification with a modulated power supply signal in accordance with an embodiment of the invention is shown. A system input 18 is connected to a signal conditioner 10. The signal conditioner 10 is then connected to a modulator 13, an active voltage compensation (AVC) circuit 15, and a power amplifier (PA) 17. The modulator 13 is connected to the AVC circuit 15, which is then connected to the PA 17. A system output is connected to an output of the PA 17.

In operation, the PA 17 provides signal power amplification from a transformed system input 20 to the system output 19. The signal conditioner 10 applies a transformation to the system input 18 and generates the result as the transformed system input 20. This transformation adjusts for non-linear amplification properties of the PA 17 in order to achieve greater amplification linearity between the system input 18 and the system output 19. In other embodiments, the signal conditioner 10 does not transform the system input 18 to the transformed system input 20 and the system input 18 is directly connected to the PA 17.

The PA 17 is powered by a power supply signal 16. The power supply signal 16 tracks an envelope of the system input 18 and is generated using a combination of components: the signal conditioner 10, the modulator 13, and the AVC circuit 15.

The signal conditioner 10 uses the system input 18 to generate two control signals: a modulator control signal 11 and a low-power modulated signal 12. These two control signals are each generated as a function of the envelope of the system input 18. The modulator 13 uses the modulator control signal 11 to generate a high-power modulated signal 14, which is used to supply power to the AVC circuit 15. The AVC circuit 15 generates the power supply signal 16 as a function of the low-power modulated signal 12 while using the power from the high-power modulated signal 14. The AVC circuit 15 actively compensates the voltage of the power supply signal 16 so that it tracks the envelope of the system input 18. The power supply signal 16 is delivered to the PA 17 through a low impedance output of the AVC circuit 15. More particularly, one effect of the AVC circuit 15 is to take a signal from a high impedance output of the modulator and convert it to a signal of low impedance. As mentioned at the outset, the high impedance has been a factor between the applicability of voltage modulated power supply due to its effect upon the noise in the output spectrum. The circuit of FIG. 1 has improved noise performance at the output.

FIG. 1 shows a single signal conditioner 10 producing modulator control signal 11, low-power modulated signal 12 and transformed system input 20. This represents any function or combination of functions implemented in any appropriate combination of hardware, software or firmware that produces these signals. For example, a single functional block may generate all three signals, or there may be multiple processing paths for one or more of the signals. A detailed example of the signal conditioner 10 is described below with reference to FIG. 2.

Figure 2:
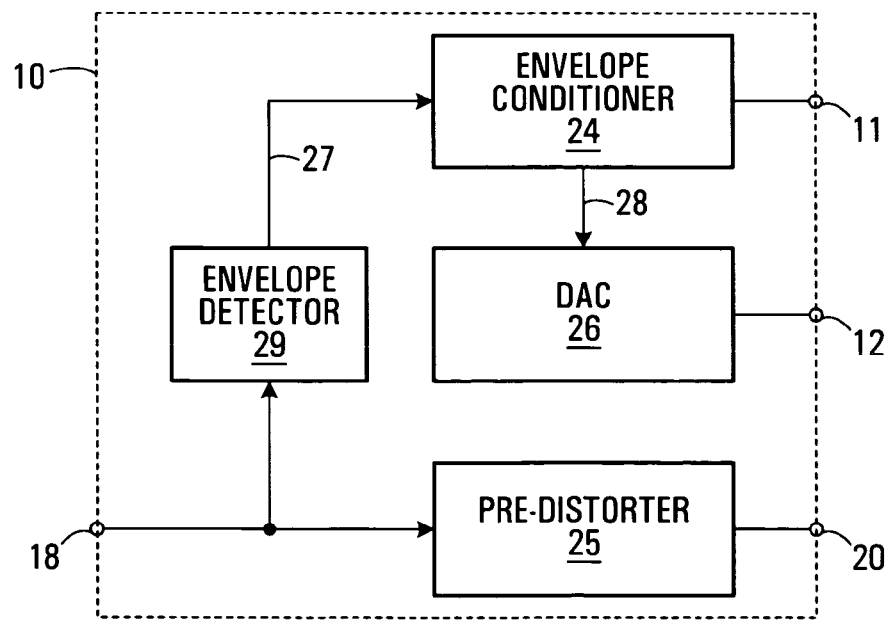
FIG. 2 is a schematic of an example implementation for the signal conditioner of FIG. 1.

Turning now to FIG. 2, a schematic of an example implementation for the signal conditioner 10 used to condition the system input 18 for the modulator 13, AVC circuit 15, and PA 17 is shown. The system input 18 is connected to an envelope detector 29 and a pre-distorter 25. An output of the pre-distorter 25 is connected to the transformed system input 20. The envelope detector 29 is connected to an envelope conditioner 24. An output of the envelope conditioner 24 is connected to the modulator control signal 11. Another output of the signal conditioner 24 is connected to a digital to analog converter (DAC) 26, which has an output connected to the low-power modulated signal 12.

In operation, the pre-distorter 25 applies a pre-distortion transformation to the system input 18 and generates the transformed system input 20. Pre-distortion is applied in order to adjust for non-linear properties of the PA 17 so that the amplification linearity between the system input 18 and the system output 19 is improved. Preferably, the pre-distortion transformations are performed digitally using a digital signal processor (DSP).

The envelope detector 29 generates an envelope signal 27 from the system input 18. For a continuous system input, the envelope conditioner 24 samples the envelope signal 27 in order to enable digital signal processing (DSP) for the generation of the modulator control signal 11 and a DAC control signal 28. The envelope conditioner 24 performs synchronisation between the modulator control signal 11 and the DAC control signal 28. A time delay is experienced by the modulator control signal 11 and the low-power modulated signal 12 as they traverse through their respective paths towards a destination inside the AVC 15. Synchronisation is performed in order to compensate for time delays so that the modulator control signal 11 and the low-power modulated signal 12 arrive at the destination at the same time.

In some implementations, a power supply signal 16 must be above a minimum operating voltage required for PA 17 operation notwithstanding how low the input signal 18 might go. Therefore, in the event that the envelope signal 27 is below a given threshold, the envelope conditioner 24 adjusts the modulator control signal 11 and the DAC control signal 28 such that the power supply signal 16 attains a minimum operating voltage. The modulator control signal 11 and DAC control signal 28 are encoded by the envelope conditioner 24, for example using pulse width modulation (PWM). Other digital encoding schemes can be used such as sigma delta modulation (SDM) for example. The DAC 26 converts the DAC control signal 28 to the low-power modulated signal 12. The accuracy of the power supply signal 16 is sensitive to the accuracy of the low-power modulated signal 12. Therefore, the DAC control signal 28 used to generate the low-power modulated signal 12 is preferably a high-resolution signal. The resolution of the modulator control signal 11 has less of an effect on the accuracy of the power supply signal 16, so it can be lower resolution. The envelope conditioner 24 encodes the modulator control signal 11 in such a manner so that the modulator 13 generates the high-power modulated signal 14 with a DC bias allowing headroom for a DC voltage drop introduced by the AVC circuit 15. Preferably, the modulator control signal 11 is a digital signal that drives the modulator 13, and the low-power modulated signal 12 is a low power analog signal.

Figure 3:
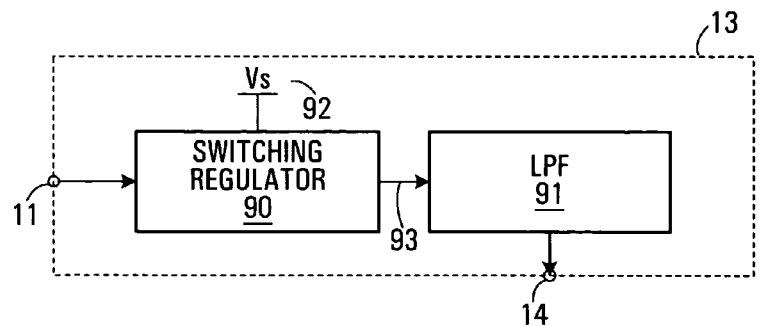
FIG. 3 is a schematic of an example implementation for the modulator of FIG. 1.

Turning now to FIG. 3, a schematic of an example implementation for the modulator 13 used to generate the high-power modulated signal 14 is shown. The modulator control signal 11 is connected to a switching regulator, which is then connected to a low pass filter (LPF) 91. The LPF 91 has an output connected to the high-power modulated signal 14. The switching regulator 90 has a static power supply $V_S$ 92 connected to it.

In operation, the switching regulator 90 amplifies the modulator control signal 11 into a raw high-power modulated signal 93 while using power from the power supply $V_S$ 92. The modulator control signal 11 is an envelope of the input signal 18 and is preferably PWM encoded. Other digital encoding schemes can be used such as SDM for example. The switching regulator 90 amplifies the modulator control signal 11 so that the power supply signal 16 has a voltage just sufficient to allow linear amplification for the PA 17. PWM is usually employed in applications requiring high efficiency energy conversion or control. The basic principle involves the creation of a rectangular waveform of variable duty-cycle such that the mean level varies to form the desired waveshape. The switching regulator 90 uses the PWM encoded modulator control signal 11 with the desired output waveshape contained in its mean value and amplifies this switching waveform efficiently before low-pass filtering it by LPF 91. In another embodiment, a high-efficiency amplifier such as a class-S amplifier is used instead of the switching regulator 90.

The switching regulator 90 is coupled with the LPF 91 in order to attenuate high-frequency noise produced from the PWM operation of the switching regulator 90. The raw high-power modulated signal 93 enters the LPF 91 and the high-power modulated signal 14 exits. In general, the LPF 91 can be any filter able to attenuate high-frequency noise to a desired level in the raw high-power modulated signal 93. In some embodiments, the LPF 91 is a $4^{th}$ order Butterworth low pass filter, which provides a flatter passband amplitude response in comparison to other filters such as Chebyshev and Bessel filters. The Chebyshev filter presents a steeper roll off and introduces band ripples. These band ripples make the Chebyshev filter less suitable for the LPF 91. The Bessel filter is a viable option for the LPF 91 because it has an advantage of providing a flatter group delay or a better linear phase in the phaseband. Its disadvantage in comparison to the Butterworth filter is that it has a very poor initial stop band attenuation characteristic. However, the roll off of the $4^{th}$ order Butterworth filter can be achieved with a Bessel filter with an order of 6 or 7.

Figure 4:
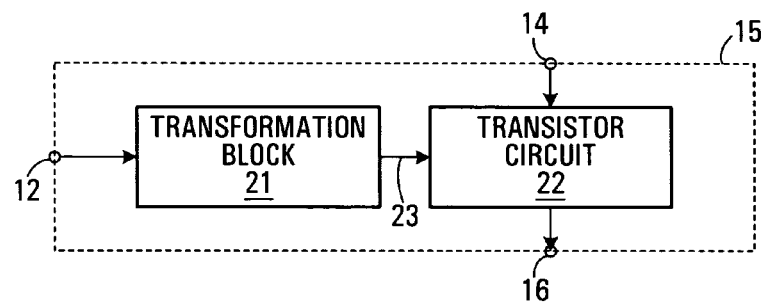
FIG. 4 is a schematic of an example implementation for the active voltage compensation (AVC) circuit of FIG. 1.

Turning now to FIG. 4, a schematic of an example implementation of the AVC circuit 15 is shown in accordance with an embodiment of the invention. The low-power modulated signal 12 is connected to a transformation block 21. The transformation block 21, and the high-power modulated signal 14 are both connected to a transistor circuit 22. The transistor circuit 22 has an output for the power supply signal 16.

In operation, the transformation block 21 prepares the low-power modulated signal 12 for the transistor circuit 22 by generating a transformed low-power modulated signal 23. The transistor circuit 22 uses the transformed low-power modulated signal 23 and the high-power modulated signal 14 to generate the power supply signal 16 as a function of the transformed low-power modulated signal 23. In some embodiments, the transistor circuit 22 generates the power supply signal 16 as the transformed low-power modulated signal 23 with significant current gain but little or no voltage gain. Therefore, the transformation block 21 provides voltage gain such that the transformed low-power modulated signal 23 has a desired voltage range for the power supply signal 16. The power supply signal 16 is generated and delivered through a low impedance output of the transistor circuit 22.

Figure 5:
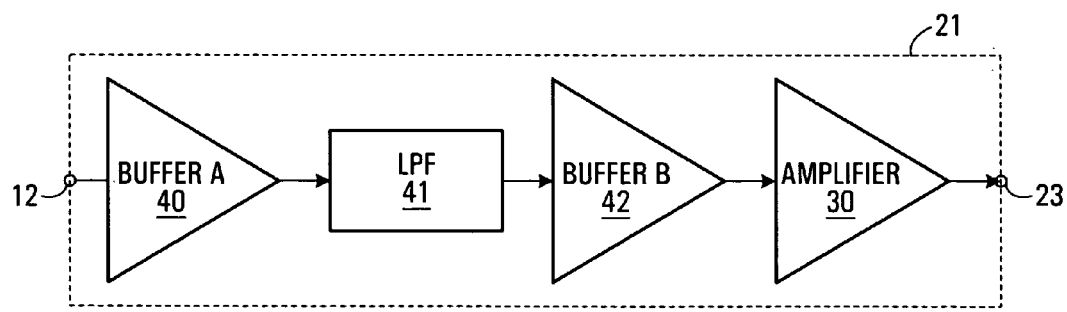
FIG. 5 is a schematic of an example implementation of the transformation block of FIG. 4.

Turning now to FIG. 5, an example implementation of the transformation block 21 used to transform the low-power modulated signal 12 into the transformed low-power modulated signal 23 is shown. The low-power modulated signal 12 is connected to a buffer A 40, which is then connected to a low pass filter (LPF) 41, which is then connected to a buffer B 42, which is then connected to an amplifier 30. Amplifier 30 has an output connected to the transformed low-power modulated signal 23.

In operation, the buffer A 40, buffer B 42, and amplifier 30 work together to provide a compounded voltage gain to the low-power modulated signal 12. The low pass filter LPF 41 attenuates residual high frequency noise generated by the envelope conditioner 24 PWM encoding to a desired level. In some embodiments, the LPF 41 is a $4^{th}$ order Butterworth low pass filter. In another embodiment, the LPF 41 is a Bessel low pass filter. Numerous different filter implementations are possible with varying advantages and disadvantages as described earlier for the LPF 91. The transformed low-power modulated signal 23 is a voltage-amplified and filtered version of the low-power modulated signal 12.

Figure 6A:
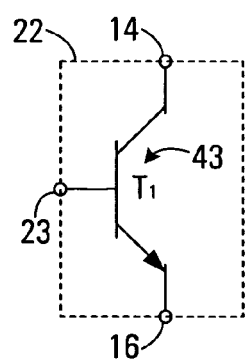
FIGS. 6A, 6B, 6C, and 6D are circuit diagrams illustrating example implementations of the transistor circuit of FIG. 4.
Figure 6B:
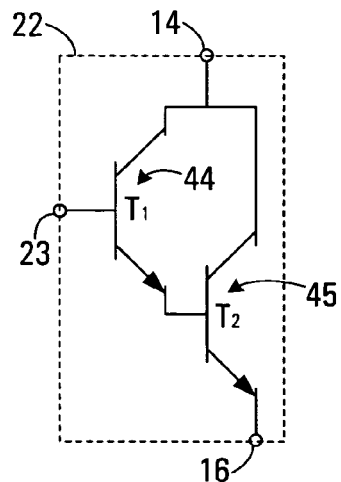
Figure 6C:
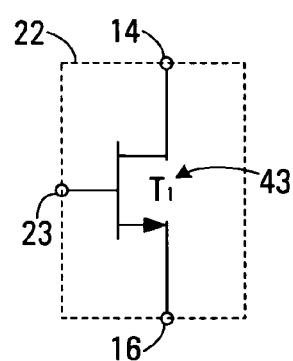
Figure 6D:
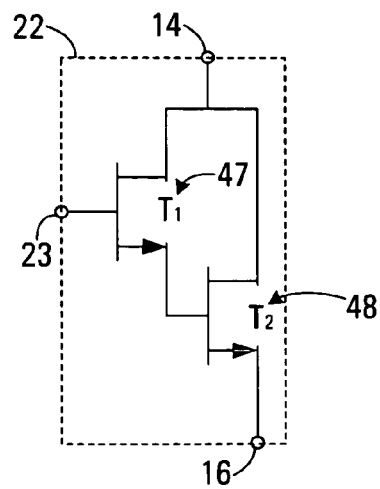

Turning now to FIGS. 6A, 6B, 6C, and 6D, several different example implementations are illustrated for the transistor circuit 22. Transistors appearing in FIG. 6A and 6B are NPN bipolar junction transistors (BJTs), each of which contains a base, a collector, and an emitter. Transistors appearing in FIGS. 6C and 6D are N-channel field effect transistors (FETs), each of which contains a gate, a drain, and a source.

FIG. 6A contains a transistor $T_1$ 43 with the base connected to the transformed low-power modulated signal 23, the collector connected to the high-power modulated signal 14, and the emitter connected to the power supply signal 16.

In operation, the $T_1$ 43 base is driven by the transformed low-power modulated signal 23 and the collector is powered by the high-power modulated signal 14. The generated power supply signal 16 follows the transformed low-power modulated signal 23 with a small voltage drop across the base and emitter. Therefore, a voltage gain of near 1V/V is achieved. However, a substantial current gain is achieved depending on a beta ($\beta$) value for the transistor. The current drawn from the collector is $\beta$ times the amount of current drawn from the base. The current generated at the emitter is equal to the current supplied by the base plus the current supplied by the collector. Therefore, the emitter generates a current equal to ($\beta$+1) times the amount of current presented to the base. A notable current gain is produced from the transformed low-power modulated signal 23 to the power supply signal 16. Furthermore, the output impedance seen at the power supply signal is very low due to the BJT impedance reflection rule.

FIG. 6B contains a first transistor $T_1$ 44 with a current gain $\beta_1$ and a second transistor $T_2$ 45 with a current gain $\beta_2$. The transformed low-power modulated signal 23 is connected to the $T_1$ 44 base. The high-power modulated signal 14 is connected to the collectors of $T_1$ 44 and $T_2$ 45. The $T_1$ 44 emitter is connected to the $T_2$ 45 base. The $T_2$ 45 emitter is connected to the power supply signal 16.

In operation, $T_1$ 44 and $T_2$ 45 are arranged in series to advantageously provide more current gain than a single transistor. This particular transistor arrangement is called a Darlington pair, which has a current gain of ($\beta_1+\beta_2+\beta_1\beta_2$) Since the product $\beta_1\beta_2$ is relatively large in comparison to the other two terms, the current gain can be approximated as $\beta_1\beta_2$. The output impedance seen at the power supply signal 16 is very low due to the BJT impedance reflection rule.

FIG. 6C contains a transistor $T_1$ 46 with the gate connected to the transformed low-power modulated signal 23, the drain connected to the high-power modulated signal 14, and the source connected to the power supply signal 16.

FIG. 6D contains a transistor pair $T_1$ 47 and $T_2$ 48. The transformed low-power modulated signal 23 is connected to the $T_1$ 47 gate. The high-power modulated signal 14 is connected to the drains of $T_1$ 47 and $T_2$ 48. The $T_1$ 47 source is connected to the $T_2$ 48 gate. The $T_2$ 48 source is connected to the power supply signal 16.

In operation, FIGS. 6C and 6D operate much like FIGS. 6A and 6B in that a voltage gain of near 1V/V is achieved while a significant current gain is achieved between the transformed low-power modulated signal 23 to the power supply signal 16. In some embodiments, the FETs in FIGS. 6C and 6D are LDMOS FETs.

Figure 7:
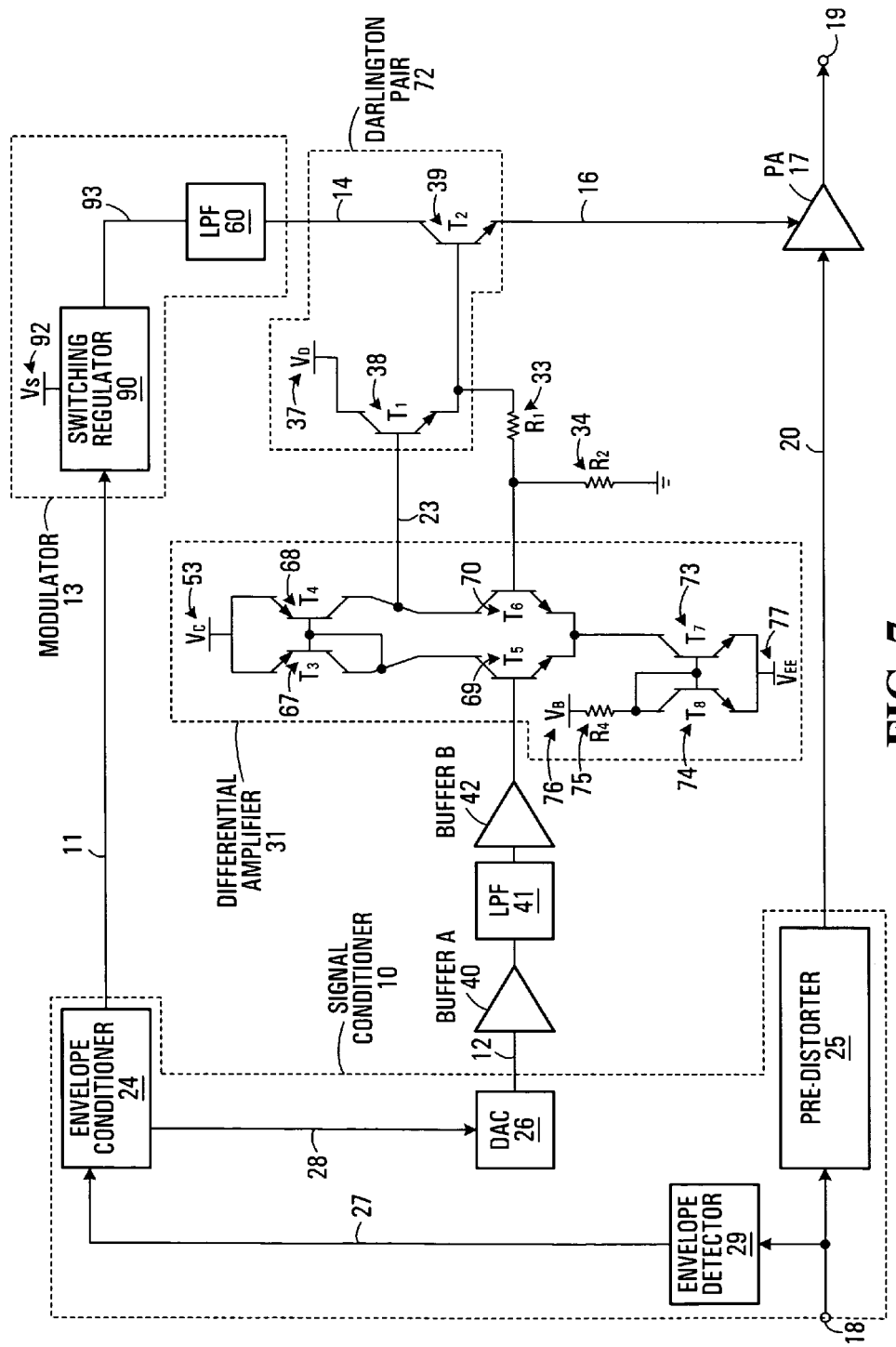
FIG. 7 is a circuit diagram of another system providing signal power amplification in accordance with an embodiment of the invention.

Turning now to FIG. 7, a circuit diagram of another system providing signal power amplification with a modulated power supply signal in accordance with another embodiment of the invention is shown. The circuit has NPN BJTs $T_1$ 38, $T_2$ 39, $T_5$ 69, $T_6$ 70, $T_7$ 73, and $T_8$ 74, and PNP BJTs $T_3$ 67 and $T_4$ 68. All BJTs contain a base, a collector, and an emitter. A similar circuit can be constructed using other transistor technologies.

The system input 18 is connected to the pre-distorter 25, which is then connected to the PA 17. An output of the PA 17 is connected to the system output 19. The system input 18 is also connected to envelope detector 29, which is then connected to the envelope conditioner 24, which is then connected to the DAC 26. An output of the DAC 26 is connected to the buffer A 40, which is then connected to the LPF 41, which is then connected to the buffer B 42. An output of buffer B 42 is connected to the $T_5$ 69 base. Transistors $T_5$ 69 and $T_6$ 70 both have their emitters connected to the $T_7$ 73 collector. The $T_7$ 73 emitter is connected to a power supply $V_{EE}$ 77 while the base is connected to the $T_8$ 74 base, the $T_8$ 74 collector, and a resistor $R_4$ 75. The $T_8$ 74 emitter is connected to $V_{EE}$ 77 while $R_4$ 75 is connected to a power supply $V_B$ 76. The $T_5$ 69 collector is connected to the $T_3$ 67 base, the $T_3$ 67 collector, and the $T_4$ 68 base. The emitters of $T_3$ 67 and $T_4$ 68 are both connected to a power supply $V_C$ 53. The $T_4$ 68 collector and the $T_6$ 70 collector are both connected to the $T_1$ 38 base. The $T_1$ 38 collector is connected to a power supply $V_D$ 37. The $T_1$ 38 emitter is connected to the $T_2$ 39 base and a resistor $R_1$ 33. $R_1$ 33 is connected to the $T_6$ 70 base and to $R_2$ 34. The $R_2$ 34 is then connected to ground. Another output of the envelope conditioner 24 is connected to the switching regulator 90, which is connected to a power supply $V_S$ 92. The switching regulator 90 is connected to a low pass filter (LPF) 60, which is then connected to the $T_2$ 39 collector. The $T_2$ 39 emitter is connected to the PA 17.

The combination of $T_3$ 67, $T_4$ 68, $T_5$ 69, $T_6$ 70, $T_7$ 73, $T_8$ 74, $R_4$ 75 and all related connections between these items comprise the differential amplifier 31. Other implementations are possible.

The $T_1$ 38, $T_2$ 39, and all related connections between these items comprise the Darlington pair 72.

The combination of the pre-distorter 25, envelope detector 29, envelope conditioner 24, DAC 26, and all related connections between these items comprise the signal conditioner 10.

The combination of the switching regulator 90, power supply $V_S$ 92, LPF 60, and all related connections between these items comprise the modulator 13.

In operation, the signal conditioner 10 functions in the same manner as described earlier in FIG. 2. Therefore, only supplemental details are provided here. In particular, the DAC control signal 28 is generated with a high degree of resolution using a resolution of around 10 or 11 bits. The DAC 26 generates the low-power modulated signal 12 as a 10 $mA_{rms}$ current waveform. The modulator control signal 11 has a smaller resolution of 7 or 8 bits. The envelope conditioner 24 performs synchronisation between the modulator control signal 11 and the DAC control signal 28. Synchronisation is performed so that the modulator control signal 11 and the low-power modulated signal 12 arrive at the same time at the $T_2$ 39 collector and $T_1$ 38 base, respectively. Synchronisation accounts for delays in system components such as the LPF 60, LPF 41, buffer A 40, and buffer B 42.

The weak low-power modulated signal 12 is buffered and amplified through a series connection of buffer A 40, LPF 41, buffer B 42, and the differential amplifier 31. The differential amplifier 31 is coupled with the transistor pair $T_1$ 38 and $T_2$ 39 as to provide the differential amplifier 31 with a negative feedback connection. Resistors $R_1$ 33 and $R_2$ 34 are engineered for appropriate voltage gain in the differential amplifier 31; example values for $R_1$ 33 and $R_2$ 34 are 250$\Omega$ and 50$\Omega$, respectively. These values give the differential amplifier 31 a voltage gain of 5V/V. A current source of the differential amplifier 31 is designed in part by designing the power supply $V_B$ 76, the power supply $V_{EE}$ 77, and the resistor $R_4$ 75. Example values for $V_B$ 76, $V_{EE}$ 77, and $R_4$ 75 are 0V, −5V, and 215Ω, respectively. The negative voltage for $V_{EE}$ 77 is preferred so that saturation of transistors $T_5$ 69 and $T_6$ 70 is avoided during operation when low voltage levels drive their bases. For example, if the base voltage of $T_5$ 69 and $T_6$ 70 is 0.8V then the $T_5$ 69 and $T_6$ 70 emitters will be at 0.1V; therefore, the $T_7$ 73 and $T_8$ 74 should be connected to a voltage of −3V or less. The differential amplifier 31 is supplied with the power supply $V_C$ 53. An example value for $V_C$ 53 is +40V, which allows the transformed low-power modulated signal 23 to achieve an appropriate voltage range.

In a specific design, transistor $T_1$ 38 is a medium power high gain transistor with a rated power of at least 3 W, a current gain of $\beta_1$=450, a maximum collector current of $I_c$=1 A, a collector emitter voltage at saturation of $V_{ce(sat)}$=110 mV at $I_c$=1 A, a power dissipation of at least $P_{diss}$=2.5 W, and a high transition frequency $f_T$=100 MHz at $V_{ce}$=2V and $I_c$=350 mA. Also in the specific design, transistor $T_2$ 39 is a high-power transistor with a rated power of up to 100 W, a highest possible current gain, a maximum collector current of $I_c$=20 A, a collector emitter voltage at saturation of $V_{ce(sat)}$=2V at $I_c$=7 A, a power dissipation of at least $P_{diss}$=15 W, a high transition frequency $f_T$=100 MHz at $V_{ce}$=2V and $I_c$=7 A, and a lowest possible output impedance. In another embodiment, the transistor $T_1$ 43 in FIG. 6A is used in place of the Darlington pair 72 and the $T_1$ 43 has substantially similar characteristics to those described in the specific design for the transistor $T_2$ 39.

The power supply signal 16 generated by the Darlington pair 72 tracks the transformed low-power modulated signal 23. An example operating condition of the PA 17 is that the power supply signal 16 has an operating range of +5V to +30V. Therefore, the high-power modulates signal 14 has a voltage range of around +7V to +32V while the transformed low-power modulated signal 23 has a voltage range of around +6.4V to +31.4V. The additional +2V seen in the high-power modulated signal 14 range accounts for a collector-emitter voltage drop of $T_2$ 39 while the additional 1.4V seen in transformed low-power modulated signal 23 voltage range accounts for the base-emitter voltage drop for each transistor $T_1$ 38 and $T_2$ 39. The envelope conditioner 24 ensures that the power supply signal 16 functions within this operating range by controlling the voltage ranges of the modulator control signal 11 and the DAC control signal 28. Instead of being connected to the high-power modulated signal 14 as would be the case in the embodiments where the Darlington pair of FIG. 6B is employed, the $T_1$ 38 collector is connected to the power supply $V_D$ 37. An example value for $V_D$ 37 is +33V. Advantageously, the isolation between the raw high-power modulated signal 93 and the power supply signal 16 is improved by connecting the $T_1$ 38 collector to $V_D$ 37. The modulated control signal 11 is encoded by the envelope conditioner 24 in such a manner so that the switching regulator 90 generates the high-power modulated signal 14 with a DC component that is +2V to +6V greater than the DC component of the power supply signal 16. This additional DC component provides headroom for a voltage drop between the collector and emitter of $T_2$ 39.

Figure 8A:
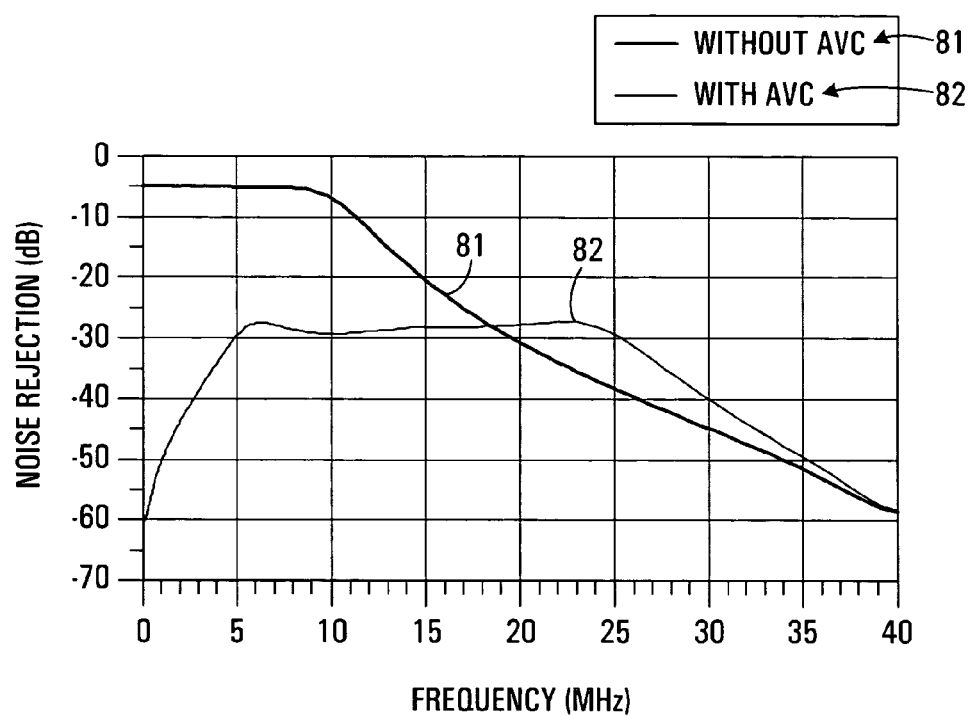
FIGS. 8A and 8B are plots showing example noise rejection and output impedance achieved with and without using the AVC circuit.

Turning now to FIG. 8A, a graphical depiction is shown to provide an example of the frequency-variable noise rejection achieved between the raw high-power modulated signal 93 and the power supply signal 16 with an example implementation. Plots 82 and 81 show the noise rejection achieved with and without using the AVC circuit 15, respectively. Utilising the AVC circuit 15 provides greater noise rejection for frequencies under 17 MHz. In particular, the noise rejection is seen to be significantly greater when using the AVC circuit 15 with frequencies under 10 MHz. Different embodiments of the invention may yield different results.

Figure 8B:
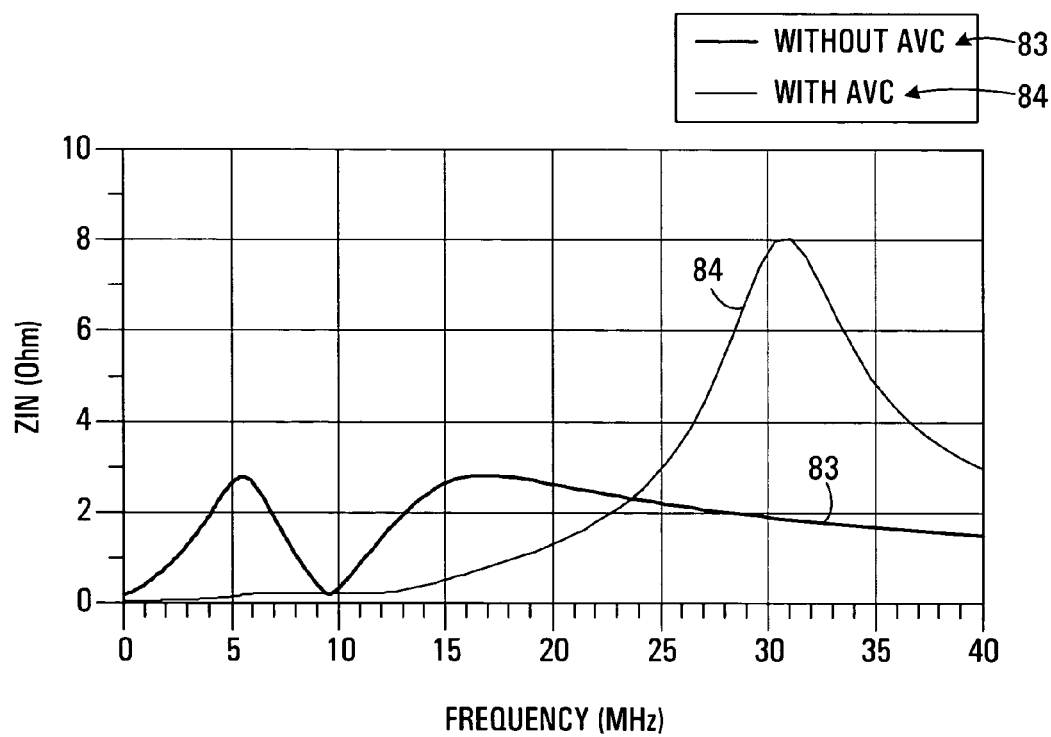

Turning now to FIG. 8B, a graphical depiction is shown to provide an example of the frequency-variable impedance seen by the PA 17 at the power supply signal 16 with an example implementation. Plots 84 and 83 show the impedance presented to the PA 17 with and without using the AVC circuit 15, respectively. The AVC circuit 15 reduces the impedance for frequencies under 23 MHz. In particular, the impedance is significantly reduced for frequencies under 10 MHz. Different embodiments of the invention may yield different results.

What has been described is merely illustrative of the application of the principles of the invention. Other arrangements and methods can be implemented by those skilled in the art without departing from the spirit and scope of the present invention.

The invention claimed is:

1. A system providing signal power amplification, the system comprising:
   a power amplifier providing signal power amplification to an input signal to produce an output signal, the power amplifier receiving a power supply signal;
   a modulator generating a high-power modulated signal as a function of the input signal; and
   an active compensation circuit converting the high-power modulated signal into the power supply signal and delivering this to the power amplifier through a low impedance output, wherein the modulator produces the high-power modulated signal such that it is substantially proportional to an envelope of the input signal, wherein:
   the active compensation circuit has a first input accepting a low-power modulated signal that is substantially proportional to an envelope of the input signal and has a second input accepting the high-power modulated signal;
   the active compensation circuit produces the power supply signal through a low impedance output by applying the power of the high-power modulated signal to the low-power modulated signal.

2. The system of claim 1 further comprising at least one signal conditioner circuit adapted to produce a modulator control signal for the modulator and the low-power modulated signal.

3. The system of claim 2 wherein the at least one signal conditioner circuit generates the modulator control signal for the modulator and the low-power modulated signal with an offset to compensate for voltage drops across the active compensation circuit.

4. The system of claim 1 wherein the active compensation circuit comprises a transistor with a low output impedance, a fast frequency response, and a high power handling capability.

5. The system of claim 4 wherein die transistor is a bipolar junction transistor (BJT) having a base connected to receive the low-power modulated signal, a collector connected to receive the high-power modulated signal and an emitter connected to produce the power supply signal.

6. The system of claim 4 wherein the transistor is a field effect transistor (FET) having a gate connected to receive the low-power modulated signal, a drain connected to receive the high-power modulated signal and a source connected to produce the power supply signal.

7. The system of claim 1 wherein the active compensation circuit comprises a Darlington pair of transistors with a low output impedance, a fast frequency response, and a high power handling capability.

8. The system of claim 7 wherein the Darlington pair comprises a first BJT and a second BJT with a collector of both BJTs connected to receive the high power modulated signal, an emitter of the second BJT connected to produce the power supply signal, an emitter of the first BJT connected to a base of the second BJT, and a base of the first BJT connected to receive the low power modulated signal.

9. The system of claim 7 wherein the Darlington pair comprises a first FET and a second FET with a drain of both FETs connected to receive the high power modulated signal, a source of the second FET connected to produce the power supply signal, a source of the first FET connected to a gate of the second FET, and a gate of the first FET connected to receive the low power modulated signal.

10. The system of claim 1 wherein the low-power modulated signal is of relatively high resolution compared with the high-power modulated signal.

11. The system of claim 2 wherein the at least one signal conditioner comprises:
a pre-distorter adapted to predistort the input signal before the input signal is passed to the power amplifier;
an envelope detector to detect the envelope of the input signal; and
an envelope conditioner for producing the modulator control signal for the modulator and the low power modulated signal.

12. The system in claim 11 wherein the envelope conditioner synchronises the modulator control signal and the low power modulated signal so that the low-power modulated signal and the high-power modulated signal arrive synchronously within the active compensation circuit.

13. The system in claim 11 wherein the envelope conditioner generates the high power modulated signal and the low power modulated signal so that the power supply signal is always greater than a predetermined minimum.

14. The system of claim 1 wherein the modulator comprises:
a switching regulator and a low pass filter connected in sequence.

15. The system of claim 1 wherein the active compensation circuit comprises:
transformation circuitry adapted to perform voltage amplification and filtering of the low-power modulated signal before the active compensation circuit applies the power of the high-power modulated signal to the low-power modulated signal.

16. The system of claim 15 wherein:
the transformation circuitry comprises a first buffer, a low pass filter, a second buffer, connected in sequence and to a first input of a differential amplifier, a second input of the differential amplifier connected to a feedback path.

17. A method of providing signal power amplification, the method comprising:
applying signal power amplification from an input signal to an output signal with use of a power supply signal;
generating the power supply signal as a function of the system input; and
delivering the power supply signal through a low-impedance output for the signal power amplification, wherein the power supply signal is substantially proportional to an envelope of the input signal,
wherein the power supply signal is generated using a low-power modulated signal while using power from a high-power modulated signal, the low-power modulated signal and high-power modulated signal being substantially proportional to an envelope of the system input.

18. The method of claim 17 wherein the low-power modulated signal and high-power modulated signal is generated from an envelope of the input signal with an offset to compensate for voltage drops during the generation of the power supply signal.

19. The method of claim 18 wherein the low-power modulated signal and the high-power modulated signal are synchronised so that the low-power modulated signal and the high-power modulated signal arrive synchronously where the power supply signal is generated.

20. The method of claim 18 wherein the low-power modulated signal and the high-power modulated signal are generated so that the power supply signal is always greater than a predetermined minimum.

* * * * *

UNITED STATES PATENT AND TRADEMARK OFFICE
CERTIFICATE OF CORRECTION

| | | |
|---|---|---|
| PATENT NO. | : 7,135,918 B1 | |
| APPLICATION NO. | : 10/969881 | |
| DATED | : November 14, 2006 | |
| INVENTOR(S) | : Noureddine Outaleb et al. | |

It is certified that error appears in the above-identified patent and that said Letters Patent is hereby corrected as shown below:

Column 12, line 43, insert Claim 21 as follows:

21. A system providing signal power amplification, the system comprising:

a power amplifier providing signal power amplification to an input signal to produce an output signal, the power amplifier receiving a power supply signal;

a modulator generating a high-power modulated signal as a function of the input signal; and an active compensation circuit converting the high-power modulated signal into the power supply signal and delivering this to the power amplifier through a low impedance output, wherein the modulator produces the high-power modulated signal such that it is substantially proportional to an envelope of the input signal;

wherein:

the active compensation circuit has a first input accepting a low-power signal that is substantially proportional to an envelope of the input signal and has a second input accepting the high-power modulated signal;

the active compensation circuit produces the power supply signal through a low impedance output by applying the power of the high-power modulated signal to the low-power signal.

Signed and Sealed this

Twenty-fourth Day of April, 2007

JON W. DUDAS
*Director of the United States Patent and Trademark Office*